(12) United States Patent
Brounne

(10) Patent No.: US 10,283,661 B2
(45) Date of Patent: May 7, 2019

(54) PHOTOVOLTAIC MODULE ASSEMBLY

(71) Applicant: SABIC Global Technologies B.V., Bergen op Zoom (NL)

(72) Inventor: Marcel Brounne, Breda (NL)

(73) Assignee: SABIC GLOBAL TECHNOLOGIES B.V., Bergen op Zoom (NL)

( * ) Notice: Subject to any disclaimer, the term of this patent is extended or adjusted under 35 U.S.C. 154(b) by 164 days.

(21) Appl. No.: 14/187,998

(22) Filed: Feb. 24, 2014

(65) Prior Publication Data

US 2014/0238468 A1 Aug. 28, 2014

Related U.S. Application Data

(60) Provisional application No. 61/768,938, filed on Feb. 25, 2013.

(51) Int. Cl.
| | | |
|---|---|---|
| *H01L 31/048* | (2014.01) |
| *H01L 31/049* | (2014.01) |
| *H02S 20/26* | (2014.01) |
| *H01L 31/04* | (2014.01) |
| *H02S 20/00* | (2014.01) |
| *H02S 30/00* | (2014.01) |

(52) U.S. Cl.
CPC .......... *H01L 31/048* (2013.01); *H01L 31/049* (2014.12); *H01L 31/04* (2013.01); *H02S 20/00* (2013.01); *H02S 20/26* (2014.12); *H02S 30/00* (2013.01); *Y02B 10/12* (2013.01); *Y02E 10/50* (2013.01)

(58) Field of Classification Search
CPC ..... H01L 31/04; H01L 31/048; H01L 31/049; H02S 20/00; H02S 20/26; H02S 30/00; Y02E 10/50
See application file for complete search history.

(56) References Cited

U.S. PATENT DOCUMENTS

| | | | |
|---|---|---|---|
| 4,097,310 A | 6/1978 | Lindmayer | |
| 4,724,010 A * | 2/1988 | Okaniwa | .......... H01L 31/03921 136/244 |
| 5,614,033 A | 3/1997 | Robinson et al. | |
| 6,005,184 A | 12/1999 | Barnes | |

(Continued)

FOREIGN PATENT DOCUMENTS

| | | |
|---|---|---|
| CN | 202094162 U | 12/2011 |
| DE | 102008048160 A1 | 4/2010 |

(Continued)

OTHER PUBLICATIONS

DuPont Tefzel Properties Handbook, http : // www2.dupont.com/Teflon_Industrial/en_US/tech_info/prodinfo_etfe.html . accessed Apr. 1, 2015.*

(Continued)

*Primary Examiner* — Matthew T Martin
(74) *Attorney, Agent, or Firm* — Cantor Colburn LLP

(57) ABSTRACT

A photovoltaic module assembly, comprising: a first layer; a back layer, wherein the back layer comprises a second layer, a third layer, and a support layer located between the second layer and the third layer; and a photovoltaic layer comprising photovoltaic cells, wherein the photovoltaic layer is located between the first layer and the back layer; wherein the support layer comprises a stiffening element.

20 Claims, 3 Drawing Sheets

(56) References Cited

U.S. PATENT DOCUMENTS

| | | | |
|---|---|---|---|
| 7,015,640 | B2 | 3/2006 | Schaepkens et al. |
| 7,449,246 | B2 | 11/2008 | Kim et al. |
| 2006/0001040 | A1 | 1/2006 | Kim et al. |
| 2008/0223433 | A1 | 9/2008 | Hanoka et al. |
| 2009/0114279 | A1 | 5/2009 | Zhao et al. |
| 2010/0175737 | A1* | 7/2010 | Guo et al. ............ 136/244 |
| 2011/0290319 | A1 | 12/2011 | Melcher et al. |
| 2012/0073629 | A1 | 3/2012 | Wu et al. |
| 2012/0152323 | A1* | 6/2012 | Perry et al. ............ 136/251 |
| 2012/0225519 | A1* | 9/2012 | Ehbing et al. ............ 438/73 |
| 2012/0237759 | A1 | 9/2012 | Ehbing et al. |
| 2012/0279559 | A1 | 11/2012 | Stollwerck et al. |
| 2013/0014808 | A1 | 1/2013 | Brounne et al. |
| 2013/0014821 | A1* | 1/2013 | Cheng ............ H01L 31/048 136/259 |
| 2013/0056065 | A1* | 3/2013 | Yin ............ B32B 37/15 136/256 |
| 2014/0000709 | A1* | 1/2014 | Langmaid ............ H01L 31/0483 136/259 |
| 2014/0238468 | A1* | 8/2014 | Brounne ............ 136/251 |

FOREIGN PATENT DOCUMENTS

| | | | | |
|---|---|---|---|---|
| DE | 102010038869 | A1 | 2/2012 | |
| EP | 2390093 | A1 | 11/2011 | |
| EP | 2581944 | A1 | 4/2013 | |
| JP | 3369372 | B2 | 1/2003 | |
| JP | 2009032954 | A | 2/2009 | |
| KR | 20110126383 | A | 11/2011 | |
| WO | WO 2011/039299 | * | 4/2011 | ............ H01L 31/18 |
| WO | 2011161051 | A2 | 12/2011 | |
| WO | WO 2011/153681 | * | 12/2011 | ............ H01L 31/048 |
| WO | WO 2012/154307 | * | 11/2015 | |

OTHER PUBLICATIONS http : // plastics.ulprospector.com/generics/3/c/t/acrylic-properties-processing . accessed Apr. 2, 2015.*
German Patent No. 102008048160 (A1); Publication Date: Apr. 8, 2010; Abstract Only; 1 Page.
German Patent No. 102010038869 (A1); Publication Date: Feb. 23, 2012; Abstract Only; 1 Page.
Japanese Patent No. 2009032954 (A); Publication Date: Feb. 12, 2009; Abstract Only; 1 Page.
Korean Patent No. 20110126383 (A); Publication Date: Nov. 23, 2011; Abstract Only; 1 Page.
International Publication No. 2011161051 (A2); Publication Date: Dec. 29, 2011; Abstract Only; 1 Page.
Chinese Patent No. 202094162 (U); Publication Date: Dec. 28, 2011; Abstract Only; 2 Pages.
Japanese Patent No. 3369372 (B2); Publication Date: Jan. 20, 2003; Abstract Only; 2 Pages.
International Search Report for International Application No. PCT/IB2014/058821; International Filing: Date Feb. 5, 2014; dated May 30, 2014; 6 pages.
WO 2012016732 A2; English Abstract; Date of Publication: Feb. 9, 2012; 1 page.
Written Opinion of the International Search Report for International Application No. PCT/IB2014/058821; International Filing: Date Feb. 5, 2014; dated May 30, 2014; 7 pages.
Written Opinion of the International Preliminary Examining Authority for International Application No. PCT/IB2014/058821; International Filing: Date Feb. 5, 2014; dated Mar. 13, 2015; 6 pages.

* cited by examiner

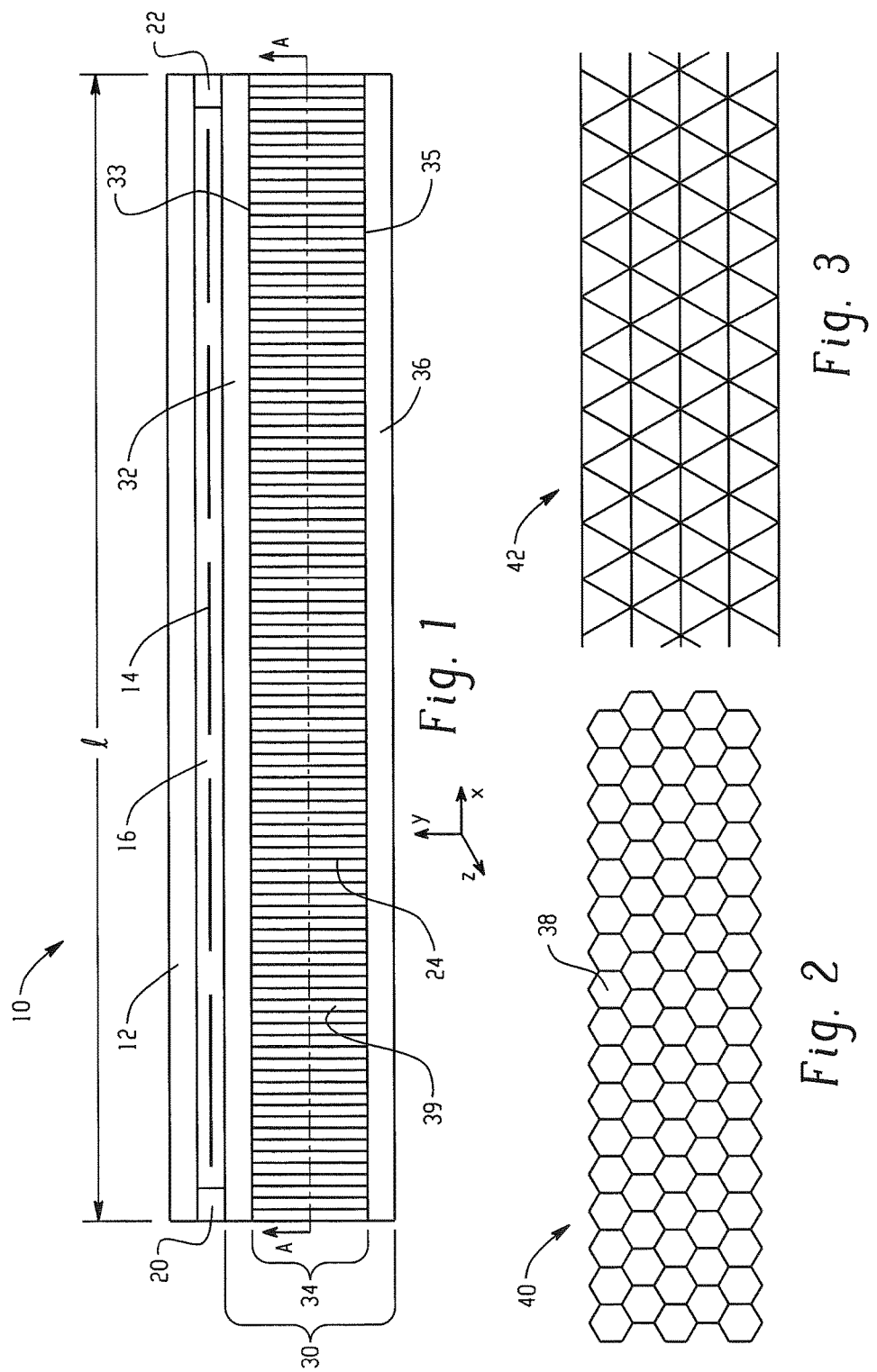

PHOTOVOLTAIC MODULE ASSEMBLY

CROSS-REFERENCE TO RELATED APPLICATION

This application claims the benefit of U.S. Provisional Patent Application Ser. No. 61/768,938 filed Feb. 25, 2013. The related application is incorporated herein by reference.

TECHNICAL FIELD

Disclosed herein are photovoltaic (PV) module assemblies.

BACKGROUND OF THE INVENTION

A PV assembly usually comprises a front sheet, generally made from a transparent or semi-transparent material such as glass, a polymer, or like materials. When the front sheet is a glass layer, a frame is typically required, which can generally be made of aluminum. The frame and the glass layer are the biggest contributors to the weight of the PV module assemblies, which can make the assemblies generally heavy and expensive to produce. When a polymer is instead used as the collector material, the mechanical properties and/or the optical efficiency of the PV assembly can be decreased. For example, for forming the collector, the polymer poly(methyl methacrylate) is good for light transmission (i.e., high optical efficiency), but lacks sufficient mechanical properties. Polycarbonate has good mechanical properties for producing the flat sheet, but has a lower optical efficiency.

Accordingly, there is a need for PV module assemblies with one or more of increased production rates, reduced assembly times, and decreased weight, while maintaining the desired mechanical and/or electrical performance properties.

SUMMARY OF THE INVENTION

Disclosed, in various embodiments, are photovoltaic modules, and methods for making and using the same.

In an embodiment, a photovoltaic module assembly, comprises: a first layer; a back layer, wherein the back layer comprises a second layer, a third layer, and a support layer located between the second layer and the third layer; and a photovoltaic layer comprising photovoltaic cells, wherein the photovoltaic layer is located between the first layer and the back layer; wherein the support layer comprises a stiffening element.

These and other features and characteristics are more particularly described below.

DESCRIPTION OF THE DRAWINGS

The following is a brief description of the drawings wherein like elements are numbered alike and which are presented for the purposes of illustrating the exemplary embodiments disclosed herein and not for the purposes of limiting the same.

FIG. 1 is a cross-sectional side view of an embodiment of a PV module assembly.

FIG. 2 is a cross-sectional view of a support layer taken along line A-A illustrating an example of a honeycomb array.

FIG. 3 is a cross-sectional view of a support layer taken along line A-A illustrating an example of a triangular array.

DETAILED DESCRIPTION OF THE INVENTION

Figure 4:
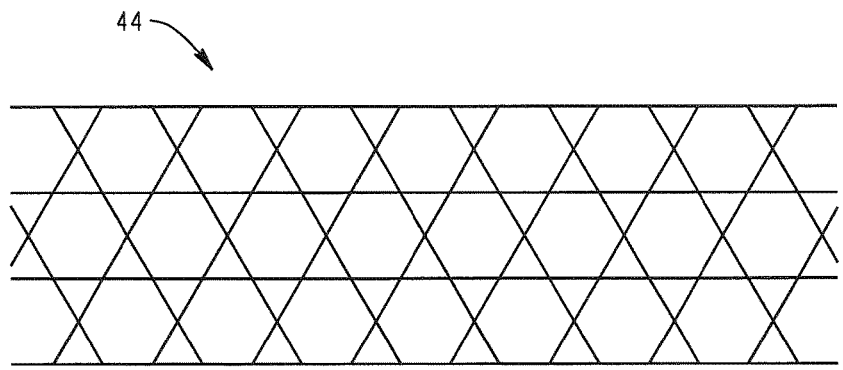
FIG. 4 is a cross-sectional view of a support layer taken along line A-A illustrating an example of an R6 array.

PV module assemblies can generally comprise a frame, a junction box, cables, connectors, a ground fault circuit interrupter (GFCI), a mounting system, a tracking system, a combiner box, a back layer, encapsulant layers (e.g., ethylene vinyl acetate encapsulant layers), wafers (i.e., PV cells), an anti-reflective layer, and/or a front layer of glass. The frame, when present, can generally be made of aluminum. The aluminum frame and the glass layer are the biggest contributors to the weight of the PV module assemblies, which can make the assemblies generally heavy and expensive to produce. Glass accounts for the largest part of the weight of a PV module assembly. When the glass is replaced with a material such as plastic, the resulting PV module assembly results in a much lighter assembly (e.g., less than or equal to 10 kilograms per square meter (kg/m$^2$), specifically less than or equal to 5 kg/m$^2$, for assemblies without glass as compared to 13 kg/m$^2$ for assemblies with glass), which can allow for placement on roofs having limited load bearing capacity (e.g., flat roofs). Replacing glass with plastic also generally results in a reduction in mechanical properties (e.g. stiffness and/or flexural strength) of the overall assembly. It was unexpectedly discovered that when a support layer is incorporated into the back layer, the mechanical properties of the PV module assembly could be increased without significantly increasing its weight.

As disclosed herein, a PV module assembly (also referred to as a PV module or a PV assembly) can comprise one or more of a first layer, a photovoltaic layer comprising a photovoltaic cell and a cured composition, a back layer comprising a second layer, a support layer, and a third layer, a junction box, cables, a micro-inverter, and an optional connector connecting the first layer to the second layer.

A more complete understanding of the components, processes, and apparatuses disclosed herein can be obtained by reference to the accompanying drawings. These figures (also referred to herein as "FIG.") are merely schematic representations based on convenience and the ease of demonstrating the present disclosure, and are, therefore, not intended to indicate relative size and dimensions of the devices or components thereof and/or to define or limit the scope of the exemplary embodiments. Although specific terms are used in the following description for the sake of clarity, these terms are intended to refer only to the particular structure of the embodiments selected for illustration in the drawings, and are not intended to define or limit the scope of the disclosure. In the drawings and the following description below, it is to be understood that like numeric designations refer to components of like function.

FIG. 1 illustrates a schematic view of the individual components of a PV module 10, wherein the PV module 10 can comprise a first layer 12; a second layer 32 that comprises a cured composition and a PV cell 14; and a back layer 30 that comprises a second layer 32, a support layer 34, and a third layer 36. FIG. 1 also illustrates that the PV module 10 can comprise a connector 20 and/or 22 (20,22) that can connect the first layer 12 and the second layer 32. The connector 20,22 can be formed (e.g., molded) as part of either the first layer 12 or the second layer 32 or the connector 20,22 can be a separate piece, as illustrated in FIG. 1. The connector 20,22 can be welded (e.g. fusion welded or laser welded) to the first layer 12 and/or the second layer 32. For example, if the connector 20,22 is molded as part of the first layer 12, where the first layer 12 comprises a poly(methyl methacrylate) and where the second layer 32 comprises an acrylonitrile-butadiene-acrylonitrile copolymer, the connector 20,22 can be laser welded to the second layer 32.

Likewise, the connector 20,22 can comprise any material that will provide the desired adhesion between the first layer 12 and the second layer 32, for example, the connector 20,22 can comprise an acrylic (e.g., acrylic tape or acrylic foam tape) or an acetate (e.g., ethylene vinyl acetate (EVA)) foam tape. In other words, the connector 20,22 can be any adhesive having sufficient structural integrity and compatibility with the first layer 12 and the second layer 32 to inhibit delamination. For example, the adhesive tape can have an adhesive strength of greater than or equal to 0.1 megaPascals (MPa), or, more specifically, greater than or equal to 0.2 MPa, as determined in accordance with ISO 4587-1979 (Adhesives—Determination of tensile lap shear strength of high strength adhesive bonds). The elongation at break of the adhesive tape can be greater than or equal to 50%, or, more specifically, greater than or equal to 80%, or, even more specifically, greater than or equal to 95%, as measured in accordance with ISO 4587-1979 (Adhesives—Determination of tensile lap shear strength of high strength adhesive bonds).

The connector 20,22 can act to form a gap between the first layer 12 and the second layer 32, into which a curable filling can be inserted (e.g., poured). The connector 20,22 can have a thickness of 0.5 to 10 millimeters (mm), or, more specifically, 1.0 to 5.0 mm, and even more specifically, 2.5 to 3.5 mm. The connector 20,22 can have a width that is less than or equal to 50% of a total surface area of the layer (e.g., the layer to which it is applied), or, more specifically, 1% to 40% of the total surface area, and, yet more specifically, 2% to 20% of the total surface area. The connector 20,22 can be located in the outer 40% of the first layer and/or the second layer (measuring from a center of the respective layer toward the edge of the respective layer), or, more specifically, in the outer 25%, and yet more specifically, in the outer 10%. For example, if the layer has a width of 1.0 meter (m), the connector 20,22 could be located between the outer edge and 0.4 m from the outer edge, or, more specifically, between the outer edge and 0.25 m from the outer edge, and yet more specifically, between the outer edge and 0.05 m from the outer edge.

The first layer, the second layer, and the third layer can be made of the same or different materials and can each independently comprise a polymeric material, e.g., a thermoplastic material. The thermoplastic material can comprise oligomers, polymers, ionomers, dendrimers, copolymers such as block copolymers, graft copolymers, star block copolymers, random copolymers, and combinations comprising at least one of the foregoing having the desired optical properties for a PV application. Examples of such thermoplastic materials include, but are not limited to, polycarbonates (e.g., blends of polycarbonate (such as polycarbonate-polybutadiene blends), and copolycarbonates (such as copolyester-polycarbonates)), polystyrenes (e.g., copolymers of polycarbonate and styrene, acrylonitrile-styrene-butadiene copolymers, and acrylonitrile-styrene-acrylonitrile (ASA) copolymers), poly(phenylene ether)-polystyrene resins, polyalkylmethacrylates (e.g., polymethacrylates, poly(methyl methacrylates) (PMMA)), polyesters (e.g., copolyesters, polythioesters), polyolefins (e.g., polypropylenes and polyethylenes, high density polyethylenes, low density polyethylenes, linear low density polyethylenes), polyamides (e.g., polyamideimides), polyethers (e.g., polyether ketones, polyether etherketones, polyethersulfones), and combinations comprising at least one of the foregoing.

More particularly, the thermoplastic material used in one or more of the first layer, the second layer, or the third layer can include, but are not limited to, polycarbonate resins (e.g., LEXAN™ resins, commercially available from SABIC's Innovative Plastics business, specifically LEXAN™ SLX2071T or LEXAN™ LUX2660T), poly(methyl methacrylate resins (e.g. ALTUGLAS™ HT121, commercially available from ARKEMA Inc.), polyphenylene ether-polystyrene resins and/or polyphenylene oxide resins (e.g., NORYL™ resins (specifically NORYL™ 6850H or PPX7110), commercially available from SABIC's Innovative Plastics business), polyetherimide resins (e.g., ULTEM™ resins, commercially available from SABIC's Innovative Plastics business), polybutylene terephthalate-polycarbonate resins (e.g., XENOY™ resins, commercially available from SABIC's Innovative Plastics business), copolyestercarbonate resins (e.g. LEXAN™ SLX resins, commercially available from SABIC's Innovative Plastics business), polypropylene resins (e.g. 83MF10-10200, commercially available from SABIC's Innovative Plastics business) and combinations comprising at least one of the foregoing resins. Even more particularly, the thermoplastic resins can include, but are not limited to, homopolymers and copolymers of: a polycarbonate, a polyester, a polyacrylate, a polyamide, a polyetherimide, a polyphenylene ether, or a combination comprising at least one of the foregoing resins. The polycarbonate can comprise copolymers of polycarbonate (e.g., polycarbonate-polysiloxane, such as polycarbonate-polysiloxane block copolymer), linear polycarbonate, branched polycarbonate, end-capped polycarbonate (e.g., nitrile end-capped polycarbonate), and combinations comprising at least one of the foregoing, for example a combination of branched and linear polycarbonate. The polycarbonate can comprise a copolymer of polycarbonate, for example a polycarbonate/acrylonitrile-styrene-acrylonitrile resin (such as GELOY™ XTPMFR15 or GELOY™ HRA222F, commercially available from SABIC's Innovative Plastics business). The thermoplastic resin can comprise a PA 12 resin (such as GRILAMID™ TR90UV, available from EMS GRIVORY).

The first layer can comprise poly(methyl methacrylate), polycarbonate, or a combination comprising one or both of the foregoing and the second and third layers can each independently comprise an acrylonitrile-styrene-acrylonitrile copolymer, a polycarbonate-acrylonitrile-styrene-acrylonitrile copolymer, poly(phenylene oxide), polypropylene, or a combination comprising one or more of the foregoing. For example, the first layer can comprise poly(methyl methacrylate) and the second and third layers can comprise an acrylonitrile-styrene-acrylonitrile copolymer. The second and third layers can, optionally, comprise the same polymer that can be different from that of the first layer.

One or more of the first, second, and third layers can include various additives ordinarily incorporated into polymer compositions of this type, with the proviso that the additive(s) are selected so as to not significantly adversely affect the desired properties of the PV module assembly, in particular, energy yield and weight savings.

Examples of additives that can be included in the materials used to make the various layers of the PV module assembly include, but are not limited to, optical effects filler, impact modifiers, fillers, reinforcing agents, antioxidants, heat stabilizers, light stabilizers, ultraviolet (UV) light stabilizers, plasticizers, lubricants, mold release agents, anti-static agents, colorants (such as titanium dioxide, carbon black, inorganic dyes, and organic dyes), surface effect additives, radiation stabilizers (e.g., infrared absorbing), gamma stabilizer, flame retardants, and anti-drip agents. A combination of additives can be used, for example a combination of a heat stabilizer, mold release agent, and ultraviolet light stabilizer. In general, the additives are used in the amounts generally known to be effective. Each of these additives can be present in amounts of 0.0001 to 10 weight percent (wt. %), specifically 0.001 to 5 wt. %, based on the total weight of the layer in which the additive is incorporated. When additives are present, additives can be added such that, for example, the second layer is white, for example to improve optical performance, and/or the third layer is black, for example to improve heat transfer.

One or more of the first, second, and third layers can optionally comprise a flame retardant. Flame retardants include organic and/or inorganic materials. Organic compounds include, for example, phosphorus, sulphonates, and/or halogenated materials (e.g., comprising bromine chlorine, and so forth, such as brominated polycarbonate). Non-brominated and non-chlorinated phosphorus-containing flame retardant additives can be preferred in certain applications for regulatory reasons, for example organic phosphates and organic compounds containing phosphorus-nitrogen bonds.

Inorganic flame retardants include, for example, $C_{1-16}$ alkyl sulfonate salts such as potassium perfluorobutane sulfonate (Rimar salt), potassium perfluorooctane sulfonate, tetraethyl ammonium perfluorohexane sulfonate, and potassium diphenylsulfone sulfonate (e.g., KSS); salts such as $Na_2CO_3$, $K_2CO_3$, $MgCO_3$, $CaCO_3$, and $BaCO_3$, or fluoro-anion complexes such as $Li_3AlF_6$, $BaSiF_6$, $KBF_4$, $K_3AlF_6$, $KAlF_4$, $K_2SiF_6$, and/or $Na_3AlF_6$. When present, inorganic flame retardant salts are present in amounts of 0.01 to 10 parts by weight, more specifically 0.02 to 1 parts by weight, based on 100 parts by weight of the total composition of the layer of the PV module assembly 10 in which it is included (i.e., the first layer 12, the second layer 32, or the third layer 36), excluding any filler.

Anti-drip agents can also be used in the composition forming one or more of the first, second, and third layers, for example a fibril forming fluoropolymer such as polytetrafluoroethylene (PTFE). The anti-drip agent can be encapsulated by a rigid copolymer, for example styrene-acrylonitrile copolymer (SAN). PTFE encapsulated in SAN is known as TSAN. An exemplary TSAN comprises 50 wt. % PTFE and 50 wt. % SAN, based on the total weight of the encapsulated fluoropolymer. The SAN can comprise, for example, 75 wt. % styrene and 25 wt. % acrylonitrile based on the total weight of the copolymer. Anti-drip agents can be used in amounts of 0.1 to 10 parts by weight, based on 100 parts by weight of the total composition of the particular layer, excluding any filler.

One or more of the first, second, and third layers can additionally comprise a silicone hardcoat and/or a plasma deposition layer, for example, on the outermost surface of the first layer 12 and/or the third layer 36 to potentially ensure a 20 year lifetime span for the PV module assembly.

It can be desirable for one or more of the first, second, and third layers to have certain optical properties. For example, the first layer can be transparent, the second layer can be transparent, semi-transparent, or opaque, and the third layer can be opaque or semitransparent, or transparent. With regards to the transparency of the various layers, it is briefly noted that end user specifications can generally specify that the various layers satisfy a particular predetermined threshold. Haze values, as measured by ANSI/ASTM D1003-00, can be a useful determination of the optical properties of one or more of the first, second, and third layers. The lower the haze levels, the higher the transparency of the individual layer. It can be desirable to monitor the haze levels of the various layers. Exemplary haze levels for the transparent first layer, when measured at a thickness of 5.0 mm, can be 0% to 6%, specifically 0.5% to 4%, and more specifically 1% to 2.5%. Exemplary haze levels for the second layer, when measured at a thickness of 5.0 mm, can be generally greater than 6%, specifically, greater than or equal to 10%. The first layer can have a transparency of greater than or equal to 80%, specifically, greater than or equal to 85%, more specifically, greater than or equal to 90%, even more specifically, greater than or equal to 95%, and still more specifically, greater than or equal to 99%, as measured in accordance with ASTM D1003-00, Procedure A or Procedure B, using lamp D65. The second and/or third layer can be semi-transparent, but can also be transparent or opaque if desired, for example, for aesthetic reasons. For example, the second and/or third layer can have a transparency of greater than or equal to 50%, specifically, greater than or equal to 65%, more specifically, greater than or equal to 75%, and even more specifically, greater than or equal to 90%. Transparency is described by two parameters, percent transmission and percent haze. Percent transmission and percent haze for laboratory scale samples can be determined using ASTM D1003-00, Procedure B using CIE standard illuminant C. ASTM D-1003-00 (Procedure B, Spectrophotometer, using illuminant C with diffuse illumination with unidirectional viewing) defines transmittance as:

$$\% T = \left(\frac{I}{I_o}\right) \times 100\% \qquad (1)$$

wherein: I=Intensity of the light passing through the test sample
$I_o$=Intensity of incident light.

Haze can be measured in accordance with ASTM D-1003-00, Procedure A, measured, e.g., using a HAZE-GUARD DUAL from BYK-Gardner, using and integrating sphere (0°/diffuse geometry), wherein the spectral sensitivity conforms to the CIE standard spectral value under standard lamp D65. ASTM D1003-00, Procedure B can also use a Macbeth 7000A spectrometer, D65 illuminant, 10° observer, CIE (Commission Internationale de L'Eclairage) (1931), and SCI (specular component included), and UVEXC (i.e., the UV component is excluded); while haze uses the same variables with Procedure A. It is noted that the percent haze can be predicted and calculated from the following equation:

$$\% \text{ Haze} = 100 \times \frac{\text{Total Diffuse Transmission}}{\text{Total Transmission}} \qquad (2)$$

wherein total transmission is the integrated transmission; and the total diffuse transmission is the light transmission that is scattered by the film as defined by ASTM D1003-00. For example, a commercially available hazemeter can be used, such as the BYK-Gardner Haze-Gard Plus, with the rough diffusing side of the film facing the detector.

It can be desirable for the refractive index of the first layer and the second layer to be close to (e.g., within 20%) the refractive index of the cured composition; it can also be desirable for the coefficient of thermal expansion of the first layer and the second layer to be close (e.g., within 15% of each other). Further, it can be desirable for the PV module assembly to pass the impact test requirements as set forth in UL 1703. Flame retardance as tested according to the standard of the Underwriters Laboratory 94 (UL 94) of the layers can be another factor to consider when selecting materials for the first layer, the second layer, and the third layer. For example, the UL 94 rating should desirably be V0 or greater (e.g., 5 VB or 5 VA). One or more of the first, second, and third layers can also desirably have an ultraviolet light stability of 20 years such that they retain greater than or equal to 80% of their light transmission capabilities over that 20 year period.

Turbulent airflow, which functions to cool the PV module, can be created by aerodynamic features integrated in the back layer. The first layer can also, optionally, be textured to decrease light reflection. Both the turbulent air flow and the texturing can provide higher energy yield during a PV module's lifetime under different circumstances, such as sunlight entering at an angle, high ambient temperatures, and partial shading of the PV module. For example, the aerodynamic features can include, but are not limited to fins, ribs, baffles, and combinations comprising at least one of the foregoing. Turbulent air flow and texturing, when integrated into a PV module can reduce cost, decrease production times, and reduce the weight of the PV module as well as optimize the yield of a system during its useful lifetime.

The back layer 30 can comprise a frame, a junction box, cables, connectors, mounting points for mounting to an external structure, and an inverter (e.g., a micro-inverter). Integration of all of these components into the back layer 30 can offer significant savings in production time, assembly time, and cost compared to a PV module where each component is produced separately and has to be assembled after production.

Generally, PV modules comprise a top layer made of glass that can function to impart rigidity to the module and a back layer, where the material of the back layer generally does not function to impart rigidity to the module. Typically, the glass top layer is 3.2 millimeters (mm) thick. As described herein, the glass top layer can be replaced with a layer comprising a thermoplastic material that can result in significant weight savings for the PV module assembly. The thickness of the first layer, the second layer, and the third layer can be, individually, 0.5 to 25 mm, specifically, 1 to 8 mm, even more specifically, 1 to 3.2 mm, specifically, 1 to 1.5 mm. The thickness of the first, second, and third layers can be the same or different.

It was surprisingly discovered that a support layer 34 can be added to the back layer 30 of a PV module 10 in order to increase the mechanical properties of the PV module when the glass top layer is replaced with a layer comprising a thermoplastic material. For example, the support layer 30 can be located between the second 32 and third layers 36 (see e.g., FIG. 1) such that the thickness of the back layer is 2 to 60 mm, specifically 5 to 40 mm, even more specifically 10 to 25 mm thick. A combined thickness of the second 32 and third layers 36 can be less than or equal to 1 mm thick.

Figure 5:
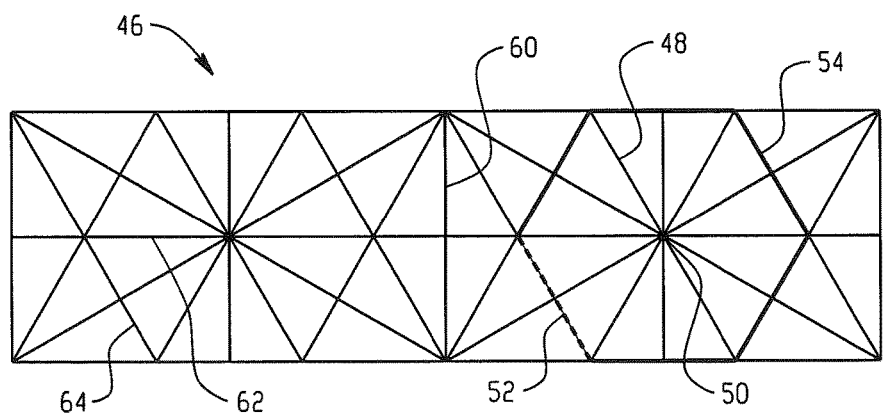
FIG. 5 is a cross-sectional view of a support layer taken along line A-A illustrating an example of a hexakis array.

The support layer 30 can comprise a stiffening element configured to improve the stiffness and/or impact properties of the PV module 10. For example, the stiffening element can comprise vertical stiffening element(s) 60 which extend in a z direction, horizontal stiffening element(s) 62 which extend in an x direction, diagonal stiffening element(s) 64 which extend between a z and x direction, or a combination comprising one or more of the foregoing (see FIG. 5). The stiffening element can be straight, curved, or jagged. The geometry formed by the stiffening elements defines the openings 38 in the support layer. These openings can have various cross-sectional geometries (in the x-z plane) including polygonal and/or rounded, such as round, oblong, multi-sided, and combinations comprising at least one of the foregoing. For example, the multi-sided cross-sectional geometry can be triagonal, quatragonal, pentagonal, hexagonal (e.g., honeycomb), heptagonal, octagonal, and the like. In other words, the openings 38 are defined by greater than or equal to 3 stiffening elements such that each opening has greater than or equal to 3 sides.

The openings 38 extend in the y direction forming channels 39. In other words, the channels 39 extend in a direction perpendicular to the length "l" of the layers.

The support layer can be formed of stiffening elements 24 and openings such that it has an array pattern, where the array pattern can be observed in the cross-section taken along line A-A (in the x-z plane) as illustrated in FIG. 1. For example, the array pattern can comprise a honeycomb array 40, a triangular array 42, an R6 array 44, a hexakis array 46, and the like (see FIGS. 2-5, respectively). The R6 array 44 is a combination of multi-sided opening geometries (also referred to as cells), e.g., a combination of 3 sided and 6 sided geometries. The hexakis array 46 includes an arrangement of triangles such that 12 stiffening elements 48 extend radially from a point 50 to stiffening elements 52 to form a six sided structure 54. The opening density can be 10 to 1,500 or more openings per 100 square centimeters ($cm^2$), specifically, 100 to 1,000 openings per 100 $cm^2$, and more specifically 150 to 700 openings per 100 $cm^2$. Generally, a support layer will comprise greater than or equal to 10 openings, specifically, greater than or equal to 50 openings, more specifically, greater than or equal to 100 openings, and still more specifically, greater than or equal to 1,000 openings.

The support layer 34 can comprise, for example the honeycomb THERMHEX™ core material, commercially available from ECONCORE N.V. and can be formed by a thermoforming, folding, and bonding process, extrusion, or otherwise.

The support layer 34 can be 1 to 35 mm, specifically 4 to 16 mm, and more specifically, 5 to 15 mm thick (as measured in the y direction).

The support layer can comprise one or more of the polymers previously described with respect to the first layer, second layer, and/or third layer, as well as one or more of the previously described additives. Specifically, the support layer can comprise polypropylene, polyethylene, polystyrene, polyethylene terephthalate, polyamide, polycarbonate, acrylonitrile-butadiene-styrene, acrylonitrile-styrene-acrylonitrile, polyurethane, polyphenylene sulfide, polyetherimide, or a combination comprising one or more of the foregoing.

As illustrated in FIG. 1, the support layer 34 can comprise a support first side 33 and/or a support second side 35. Optionally, the support layer 34 can further comprise a first and/or a second skin that can be bonded to the support first side 33 and/or the support second side 35 of the support layer 34. The skin material can be the same or different from the support layer.

The support layer 34 can comprise openings 38 as illustrated in FIG. 2. The openings 38 can be unfilled (i.e., a void space) or can be filled to provide extra support. The openings 38 can be filled with, for example, a foam (such as a polyurethane foam, a polyimide foam such as a polyetherimide foam for example ULTEM™ resin, a polystyrene foam such as STYROFOAM™, a silicone foam, or a polyvinyl chloride foam). The openings 38 extend through the support layer 34, e.g., between the second layer 32 and the third layer 36. Optionally, the openings can extend from the second layer 32 to the third layer 36.

The PV layer 16 of the PV module 10 can comprise a cured composition and a PV cell 14 (see e.g., FIG. 1). The cured composition can be one that is thermally cured, cured by ultraviolet (UV) radiation, catalyst cured, or can naturally cure when one or more reactive monomers are present. The cured composition can comprise, for example, poly(ethylene vinyl acetate) (EVA), a curable silicone (such as a silicone thermoset elastomer (TSE), a UV curable silicone, or a room temperature vulcanize (RTV) silicone), thermoplastic materials (such as aliphatic polyurethanes and/or polyolefin ionomers), and combinations comprising at least one of the foregoing. The thickness of the PV layer can be 0.5 to 10 mm, specifically, 1 to 5 mm, and even more specifically, 2 to 3.5 mm. Optionally, the thickness of the PV layer can be the same as the thickness of the connector.

FIG. 1 illustrates that PV cells 14 can be located within the PV layer 16. Examples of PV cells include monocrystalline silicon, polycrystalline silicon, amorphous silicon, silicon tandem cells, copper indium gallium selenide (CIGS), cadmium telluride (CdTe), and organic cells, as well as combinations comprising at least one of the foregoing. The various types of cells have different demands for moisture protection varying from protection against only liquid water to highly effective protection from water vapor making the moisture barrier optional.

A PV cell can be formed of layers of p-i-n semiconductive material. Optionally, each layer of which can, in turn, be formed of, a semiconductor alloy material (e.g., a thin film of such alloy material). In one embodiment, a p-i-n type PV device, such as a solar cell, can comprise individual p-i-n type cells. Below the lowermost cell can be a substrate (e.g., a transparent substrate) or a substrate comprising a metallic material such as stainless steel, aluminum, tantalum, molybdenum, chrome, or metallic particles embedded within an insulator (cermets). In some applications there is a thin oxide layer and/or a series of base contacts prior to the deposition of the amorphous semiconductor alloy material.

Each of the cells can be fabricated from a body of thin film semiconductor alloy material comprising silicon and hydrogen. Each of the bodies of semiconductor alloy material includes an n-type layer of semiconductor alloy material; a substantially intrinsic layer of semiconductor alloy material; and a p-type layer of semiconductor alloy material. The intrinsic layer can include traces of n-type or p-type dopant material without forfeiting its characteristic neutrality, hence it may be referred to as a "substantially intrinsic layer".

Also, although p-i-n type photovoltaic cells are described, the methods and materials can also be used to produce single or multiple n-i-p type solar cells, p-n type cells or devices, Schottky barrier devices, as well as other semiconductor elements and/or devices such as diodes, memory arrays, photoresistors, photodetectors, transistors, etc. The term "p-i-n type", as used herein, is defined to include any aggregation of n, i, and p layers operatively disposed to provide a photoresponsive region for generating charge carriers in response to absorption of photons of incident radiation.

The PV cell 14 converts the light energy into electrical energy. Several different types of PV cells 14 can be used. Suitable bulk technology PV cells 14 include amorphous silicon cells, multicrystalline silicon cells, and monocrystalline silicon cells. Suitable thin film technology PV cells 14 include cadmium telluride cells, copper indium selenide cells, gallium arsenide or indium selenide cells, and copper indium gallium selenide cells. In specific embodiments, the PV cell is a multicrystalline silicon PV cell or a monocrystalline silicon PV cell.

Generally, each type of PV cell has a "sweet spot", or a range of wavelengths (light energy), which it converts most efficiently into electric energy. The PV cell should be selected so that its sweet spot matches, as much as possible, the transmitted light through the optional coating, first layer, and cured composition combination. For example, the sweet spot of a multicrystalline silicon photocell or a monocrystalline silicon PV cell is 700 nanometers to 1100 nanometers. The PV cell can be selected such that it can harvest UV light with a wavelength of 200 to 400 nm.

The efficiency of a PV cell can be affected by the way the cell is produced. When PV cells are produced by cutting using a 30 micrometer diamond saw compared to laser guided water cutting, the PV cell may increase its efficiency by 1%. For example, PV cells can be produced using a DISCO DAD 321 cutter (available from Disco Corporation) operating at 30,000 rpm. See also U.S. Pat. No. 4,097,310, the disclosure of which is hereby fully incorporated by reference herein. Generally, it is desirable for the PV cell to have smooth edges and faces rather than rough edges and faces. The size (e.g., length and width) and shape of the PV cells can vary. Shapes can include various polygonal designs such as square, rectangular, and so forth. The length and width can, individually be up to 200 mm, specifically, 100 mm to 175 mm. Exemplary sizes include 100 mm by 100 mm, 125 mm by 125 mm, 150 mm by 150 mm, 156 mm by 156 mm, 175 mm by 175 mm, and 200 mm to 200 mm, 100 mm by 175 mm, and 125 mm by 150 mm.

The cured composition can additionally aid in transporting heat out of the PV cells to the atmosphere, resulting in higher efficiency for the PV module over time. As described previously, the back layer can be fully integrated with other features of the PV module assembly including, but not limited to the junction box, mounting points, and microinverter. A turbulent airflow to cool the PV module can be created by aerodynamic features integrated in the back layer. The aerodynamic features can include, but are not limited to, fins, ribs, baffles, and combinations comprising at least one of the foregoing. The first layer can optionally be textured to decrease light reflection away from the PV module, thereby increasing solar absorption of the PV module. Such a design with a textured first layer and/or aerodynamic features in the back layer can allow for a higher energy yield during a PV module's lifetime under different circumstances such as sunlight that enters at an angle, high ambient temperatures, and partial shading.

As mentioned, the replacement of a glass layer in a PV module can advantageously result in a decrease in the overall weight of the PV module, but can also result in a decrease in the stiffness and/or flexural strength. It was unexpectedly found that a support layer, specifically a support layer as described herein comprising stiffening elements, can result in an increase in one or both of the stiffness and/or flexural strength without significantly increasing the total weight of the module. Specifically, the first, second, and third layers can each, independently, comprise a plastic material and the back layer can additionally comprise an integrated assembly including the junction box, cables, controllers, and mounting points, meaning that the production time and assembly time of the PV module assembly can be decreased.

As mentioned, the first layer can comprise a plastic material, such as poly(methyl methacrylate), polycarbonate, polyamide, and combinations comprising at least one of the foregoing. Using a plastic material for the first layer can allow for the incorporation of optical textures such as Fresnel lenses to increase the amount of light captured. Incorporating features such as triangles on a surface of the first layer adjacent to the photovoltaic layer can capture light between the PV cells that would normally be lost. As previously mentioned, aerodynamic features integrated in the second layer create turbulent airflow on a surface of the second layer facing the structure to which the PV module assembly is attached (e.g., roof). The turbulent air flow can allow the PV cells to operate at lower temperatures, thus increasing the efficiency of the PV module. The curable composition can be selected so that the refractive index (RI) of this layer is close in value to the RI of the first layer, thus limiting the light lost between the cured composition and the first layer and further increasing the efficiency of the PV module. For example, the RI of PMMA is 1.49 and the RI of a cured silicone is 1.4. The refractive index of the material of the first layer can be within 15% of the refractive index of the material of the curable composition.

The overall size of the module is a function of the process used to make the module, such as injection molding. The overall size of the module can be, for example, 1 by 1 meter (m) or 1 by 2 m, or 1 by 6 m. As previously described, the size of the individual PV cells in the module can be, for example, 125 by 125 mm, specifically 156 by 156 mm.

The PV module can also comprise a first layer having a coating dispersed on the outermost surface of the first layer, e.g., a silicone hardcoat and/or a plasma coating. The plasma coating (e.g., EXATEC™ E900 coating, commercially available from EXATEC LLC) can help to ensure the PV module can function for a certain period of time, e.g., 20 years. When one of the layers comprises, for example, polycarbonate, said layer can comprise planarizing layer(s) and/or organic-inorganic composition barrier coating layer (s) which can include a silicone hardcoat and/or a plasma treatment process. The barrier coating (which can be graded or non-graded) can comprise a zone substantially organic in composition and a zone substantially inorganic in composition. Some exemplary organic-inorganic composition barrier coatings are described in U.S. Pat. No. 7,449,246. Exemplary coating compositions for the organic-inorganic barrier layer are organic, ceramic and/or inorganic materials, as well as combinations comprising at least one of the foregoing. These materials can be reaction or recombination products of reacting plasma species and are deposited onto the substrate surface. Organic coating materials typically comprise carbon, hydrogen, oxygen, and optionally other elements, such as sulfur, nitrogen, silicon, etc., depending on the types of reactants. Exemplary reactants that result in organic compositions in the coating are straight or branched alkanes, alkenes, alkynes, alcohols, aldehydes, ethers, alkylene oxides, aromatics, silicones, etc., having up to 15 carbon atoms. Inorganic and ceramic coating materials typically comprise oxide; nitride; carbide; boride; or combinations comprising at least one of the foregoing of elements of Groups IIA, IIIA, IVA, VA, VIA, VIIA, IB, and IIB; metals of Groups IIIB, IVB, and VB; and rare-earth metals. For example, the barrier coating can have optical properties that are substantially uniform along an axis of light transmission, said axis oriented substantially perpendicular to the surface of the coating.

For example, silicon carbide can be deposited onto a substrate (e.g., the first, second, or third layer) by recombination of plasmas generated from silane ($SiH_4$) and an organic material, such as methane or xylene. Silicon oxycarbide can be deposited from plasmas generated from silane, methane, and oxygen or silane and propylene oxide. Silicon oxycarbide also can be deposited from plasmas generated from organosilicone precursors, such as tetraethoxysilane (TEOS), hexamethyldisiloxane (HMDSO), hexamethyldisilazane (HMDSN), or octamethylcyclotetrasiloxane (D4). Silicon nitride can be deposited from plasmas generated from silane and ammonia. Aluminum oxycarbonitride can be deposited from a plasma generated from a mixture of aluminum tartrate and ammonia. Other combinations of reactants may be chosen to obtain a desired coating composition. A graded composition of the coating is obtained by changing the compositions of the reactants fed into the reactor chamber during the deposition of reaction products to form the coating.

The barrier coating can have a transmission rate of oxygen through the barrier coating of less than or equal to 0.1 cubic centimeters per square meter-day ($cm^3/(m^2\ day)$), as measured at 25 degrees Celsius (°C) with a gas containing 21 volume percent (vol %) oxygen. The water vapor transmission can be less than 0.01 grams per square meter-day ($g/(m^2\ day)$), as measured at 25° C. and with a gas having 100% relative humidity.

Barrier layer(s) can be applied to polymer films by various methods such as chemical vapor deposition (e.g., plasma-enhanced chemical-vapor deposition, radio-frequency plasma-enhanced chemical-vapor deposition, expanding thermal-plasma chemical-vapor deposition, electron-cyclotron-resonance plasma-enhanced chemical-vapor deposition, and inductively-coupled plasma-enhanced chemical-vapor deposition), sputtering (e.g., reactive sputtering), and so forth, as well as combinations comprising at least one of the foregoing. Some such methods are described in U.S. Pat. No. 7,015,640 and U.S. Patent Publication No. 2006/0001040.

The planarizing layer can comprise a resin such as an epoxy based resin (cycloaliphatic resin), an acrylic based resin, a silicone resin, as well as combinations comprising at least one of the foregoing. One example of a planarizing layer is a UV-cured acrylic-colloidal silica coating such as the LEXAN™ HP-H UV-cured acrylic-colloidal silica coating commercially available from the Specialty Film and Sheet business unit of SABIC's Innovative Plastics business. The planarizing layer, and/or other coatings, can further include additive(s) such as flexibilizing agent(s), adhesion promoter(s), surfactant(s), catalyst(s), as well as combinations comprising at least one of the foregoing. In some embodiments, the planarizing layer thickness can be 1 nanometer (nm) to 100 micrometers (μm). Often the planarizing layer thickness can be 100 nm to 10 μm, specifically, 500 nm to 5 μm.

The planarizing layer can be substantially smooth and substantially defect free. The term "average surface roughness" $R_a$ is defined as the integral of the absolute value of the roughness profile measured over an evaluation length. The term "peak surface roughness" $R_p$ is the height of the highest peak in the roughness profile over the evaluation length. The term "substantially smooth" means the average surface roughness $R_a$ is less than or equal to 4 nm, specifically, less than or equal to 2 nm, and more specifically, less than or equal to 0.75 nm. The peak surface roughness $R_p$ can be less than or equal to 10 nm, specifically less than or equal to 7 nm, and more specifically, less than or equal to 5.5 nm. Substantially defect free means the number of point defects is less than or equal to 100 per square millimeter (/mm$^2$), specifically, less than or equal to 10/mm$^2$, and more specifically, 1/mm$^2$.

Alternatively, one or more of the first, second, and third layers can be free of a coating. For example, when the first layer comprises poly(methyl methacrylate), the first layer can be free of a coating.

The PV module as a whole can be designed to meet several Underwriters Laboratory (UL) and International Electrotechnical Commission (IEC) standards. Table 1 lists the various components of the PV module assembly and the tests that the each component can be designed to meet.

TABLE 1

PV Module Assembly Components and Standards

| | |
|---|---|
| PV Cells | UL 1703, IEC 61215, IEC 61646, IEC 61730, UL 790, UL-SU 8703, IEC 61701, IEC 62108 |
| Junction Box | UL 1703, UL 746C, IEC 61730-1 |
| Connector | UL-SU 6703 |
| GFCI | UL 1741 |
| Polymeric Materials (e.g., second layer) | UL-SU 5703 |
| Mounting System | UL-SU 1703-A |
| Tracking System | UL-SU 9703 |
| Cable for PV Cells | UL 4703, UL 854 (USE-2) |
| Combiner Box | UL 1741 |
| Inverter | UL 1741, IEC 61209 |

The PV cells, for example, can be designed to meet Paragraphs 7.3 and 7.4 of UL 1703 Edition 3_2008. Paragraph 7.3 of UL 1703 states that a polymeric substrate or superstrate shall have a thermal index, both electrical and mechanical, as determined in accordance with the Standard for Polymeric Materials—Long Term Property Evaluations, UL 746B, not less than 90° C. (194° F.). In addition, the thermal index shall not be less than 20° C. (36° F.) above the measured operating temperature of the material. All other polymeric materials shall have a thermal index (electrical and mechanical) 20° C. above the measured operating temperature. The measured operating temperature is the temperature measured during the open-circuit mode for Temperature Test, Section 19, or the temperature during the short-circuit mode, whichever is greater. Paragraph 7.4 states that a polymeric material that serves as the outer enclosure for a module or panel that: a) is intended to be installed in a multi-module or multi-panel system; or b) has an exposed surface area greater than 10 square feet (ft$^2$) (0.93 square meters (m$^2$)) or a single dimension larger than 6 feet (ft) (1.83 meters (m)) shall have a flame spread index of 100 or less as determined under the Standard Method of Test for Surface Flammability of Materials Using a Radiant Heat Energy Source, ASTM E162-2001.

The PV module assembly can also be designed to meet the requirements set forth in Paragraph 30 of UL 1703, which describes the impact test. In order to pass the test, when a module is impacted as described below, there shall be no accessible live parts as defined in Section 15, Accessibility of Uninsulated Live Parts. Breakage of the superstrate material is acceptable provided there are no particles larger than 1 square in 6.5 square centimeters (cm$^2$) released from their normal mounting position. The impact test is described as follows in Paragraph 30.3 of UL 1703, a module or panel is to be mounted in a manner representative of its intended use, and is to be subjected to a 5 foot pound (ft-lb) (6.78 Joule (J)) impact normal to the surface resulting from a 2 inch (51 mm diameter smooth steel sphere weighing 1.18 pounds (lb) (535 grams (g)) falling through a distance of 51 inches (1.295 m). The module or panel is to be struck at any point considered most vulnerable. If the construction of a module or panel does not permit it to be struck free from above by the free falling sphere, the sphere is to be suspended by a cord and allowed to fall as a pendulum through the vertical distance of 51 inches (1.295 m) with the direction of impact normal to the surface. For a polymeric wiring enclosure, the test is to be performed on the enclosure at 25° C. (77° Farenheit (F)) and also after being cooled and maintained for 3 hours at a temperature of minus 35.0±2.0° C. (minus 31.0±3.6° F.).

IEC 61215 Edition 2_2005 provides requirements for the design qualification and type approval of terrestrial photovoltaic modules appropriate for long term operation in general open air climates. Paragraph 10.11 of IEC 61215 provides a thermal cycling test for photovoltaic assemblies. The modules are subjected to a thermal cycling test where the temperature is cycled from −40° C.±2° C. to 85° C.±2° C. and each cycle is no longer than 6 hours and the total cycle time is 1,000 hours. The photovoltaic module assemblies disclosed herein can maintain greater than or equal to 95% of the maximum power output after being exposed to a thermal cycling of −40° C.±2° C. to 85° C.±2° C. for 1,000 hours. Paragraph 10.12 of IEC 61215 provides a humidity-freeze test to determine the ability of the module to withstand the effects of high temperature and humidity followed by sub-zero temperatures. The modules are subject to a cycle of 85% relative humidity ±5% for 20 minutes and a recovery time of 2 to 4 hours. Ten such cycles are performed before the module is evaluated to determine if the maximum output power has decreased greater than 5% compared to the value measured before the test. If so, the module is considered to have failed the test. Paragraph 10.13 of IEC 61215 provides a damp heat test carried out in a climatic chamber capable to carry out the test in accordance with IEC 60068-2-3 at conditions of 85° C.±2° C. with an 85% relative humidity ±5%. The purpose of this test is to determine the ability of the module to withstand long term exposure to penetration of humidity by applying the conditions described above for 1,000 hours. The severity of this test particularly challenges the lamination process and the edge sealing from humidity. Delamination and corrosion of cell parts can be observed as a result of humidity penetration.

IEC 61646 Edition 2_2008 provides requirements for the design qualification and type approval of terrestrial thin film photovoltaic modules appropriate for long term operation in general open air climates as defined in IEC 60721-2-1. IEC 62108 describes the minimum requirements for the design qualification and type approval of concentrator photovoltaic modules and assemblies appropriate for long term operation in general open air climates as defined in IEC 60721-2-1. IEC 61701 determines the resistance of the module to corrosion from salt mist, looking at highly corrosive wet atmospheres, such as marine environments and temporary corrosive atmospheres that are also present in places where salt is used in winter periods to melt ice formations on streets and roads.

The PV module assembly disclosed herein can be designed to weigh approximately 5 kg/m$^2$ compared to 13 kg/m² for PV modules containing a glass first layer and/or aluminum frame. The layers of the PV module can be formed from a thermoplastic composition by a variety of techniques such as injection molding, extrusion, rotational molding, blow molding, and thermoforming Forming can be accomplished by injection molding. Injection molding allows for a mass producible module without necessitating the laminating process used in modules containing a glass first layer. As a result, the assembly time for the PV module can decrease from greater than or equal to 20 minutes to 1 minute to 5 minutes, specifically, 2 minutes to 3 minutes. Installation of the PV module assembly can be easier and less time consuming since the PV module is lighter and as mentioned, incorporates integrated mounting points which allow for easy installation. Additionally, the use of micro-inverters can allow the system to be a plug and play without the need for a separate inverter installation step. The overall cost of the PV module assembly can be decreased by 10% due to the faster assembly time and shorter installation time partly because of the integration of the junction box and inverter. Overall yield of the module due, for example, to partial shading, imperfect placement of the modules, or high ambient temperature, will be higher compared to other modules, further decreasing the cost of the PV module by 20%. For example, the overall yield of the module can be greater than or equal to 10% higher compared to other modules, specifically, greater than or equal to 20% higher, more specifically, greater than or equal to 25%, even more specifically, greater than or equal to 50%, and still more specifically, greater than or equal to 75% higher. One or more of the first, second, and third layers can be reground and reused in a new layer or structural support part.

The PV module assemblies can be used in solar power generation applications in various manners such as building facades, on rooftops (such as a skylight or roofing tile), in highway/railroad sound barriers, greenhouses, dual purpose window glazing, and commercial buildings.

Set forth below are some embodiments of the PV module assemblies disclosed herein.

Embodiment 1: A photovoltaic module assembly, comprising: a polymeric first layer; a back layer, wherein the back layer comprises a polymeric second layer, a polymeric third layer, and a polymeric support layer located between the second layer and the third layer; and a photovoltaic layer comprising photovoltaic cells, wherein the photovoltaic layer is located between the first layer and the back layer; wherein the support layer comprises stiffening elements that define openings that extend in a y direction that is perpendicular to a length of the first layer.

Embodiment 2: The photovoltaic module assembly of Embodiment 1, wherein the stiffening element comprises a vertical stiffening element, a horizontal stiffening element, a diagonal stiffening element, or a combination comprising one or more of the foregoing.

Embodiment 3: The photovoltaic module assembly of any of Embodiments 1-2, wherein the stiffening element comprises a honeycomb array, a triangular array, an R6 array, a hexakis array, or a combination comprising one or more of the foregoing.

Embodiment 4: The photovoltaic module assembly of any of Embodiments 1-3, wherein the stiffening element comprises a honeycomb array.

Embodiment 5: The photovoltaic module assembly of any of Embodiments 1-4, wherein the support layer comprises openings, wherein the openings are filled.

Embodiment 6: The photovoltaic module assembly of any of Embodiments 1-5, wherein the support layer has a thickness of 1 to 35 mm.

Embodiment 7: The photovoltaic module assembly of any of Embodiments 1-6, wherein the photovoltaic module has an increased stiffness and/or an increased flexural strength as compared to a photovoltaic module that does not comprise the support layer.

Embodiment 8: The photovoltaic module assembly of any of Embodiments 1-7, wherein the first layer, the second layer, and the third layer each independently comprise a thermoplastic material.

Embodiment 9: The photovoltaic module assembly of any of Embodiments 1-8, wherein the first layer comprises poly(methyl methacrylate), polycarbonate, or a combination comprising one or both of the foregoing.

Embodiment 10: The photovoltaic module assembly of any of Embodiments 1-9, wherein the first layer comprises poly(methyl methacrylate) and is free from a coating.

Embodiment 11: The photovoltaic module assembly of any of Embodiments 1-10, wherein a thickness of the first layer, the second layer, and the third layer is each independently 0.5 to 25 mm.

Embodiment 12: The photovoltaic module assembly of Embodiment 11, wherein the thickness of the first layer is 1.2 to 1.5 mm.

Embodiment 13: The photovoltaic module assembly of any of Embodiments 1-12, wherein the second layer and/or the third layer comprise an acrylonitrile-styrene-acrylonitrile copolymer, a polycarbonate-acrylonitrile-styrene-acrylonitrile copolymer, poly(phenylene oxide), polypropylene, or a combination comprising one or more of the foregoing.

Embodiment 14: The photovoltaic module assembly of any of Embodiments 1-13, wherein the first layer comprises poly(methyl methacrylate) and the second layer and/or the third layer comprise an acrylonitrile-styrene-acrylonitrile copolymer.

Embodiment 15: The photovoltaic module assembly of any of Embodiments 1-14, further comprising a connector.

Embodiment 16: The photovoltaic module assembly of Embodiment 15, wherein the connector is part of the first layer.

Embodiment 17: The photovoltaic module assembly of any of Embodiments 15-16, wherein the connector is welded to the first layer and/or the second layer.

Embodiment 18: The photovoltaic module assembly of any of Embodiments 1-17, wherein the first layer has one or both of a haze level of 0% to 6% when measured at a thickness of 5.0 mm or a transparency of greater than or equal to 80 as measured in accordance with ASTM D1003-00, Procedure A or Procedure B, using lamp D65.

Embodiment 19: The photovoltaic module assembly of any of Embodiments 1-18, wherein the second layer and/or the third layer is opaque.

Embodiment 20: The photovoltaic module assembly of any of Embodiments 1-19, wherein the second layer is white.

Embodiment 21: The photovoltaic module assembly of any of Embodiments 1-20, wherein the third layer is black.

Embodiment 22: The photovoltaic module assembly of any of Embodiments 1-21, wherein the photovoltaic layer further comprises a cured composition.

Embodiment 23: The photovoltaic module assembly of Embodiment 22, wherein the cured composition is thermally cured, cured by ultraviolet radiation, or catalyst cured.

Embodiment 24: The photovoltaic module assembly of any of Embodiments 22-23, wherein the cured composition comprises a cured silicone that is an ultraviolet cured silicone or a thermally cured silicone.

Embodiment 25: The photovoltaic module assembly of any of Embodiments 1-24, wherein the photovoltaic layer has a thickness of 0.5 to 10 mm.

The PV module assemblies as described herein are further illustrated by the following non-limiting examples.

EXAMPLES

Example 1

Figure 6:
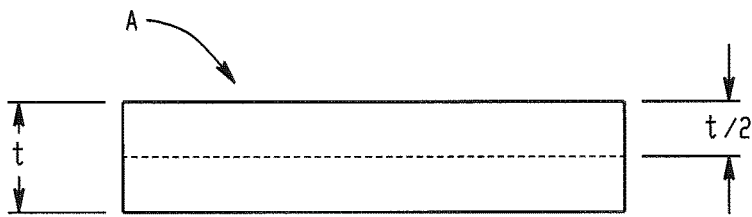
FIG. 6 is a schematic representation of Sample A of Example 1.
Figure 7:
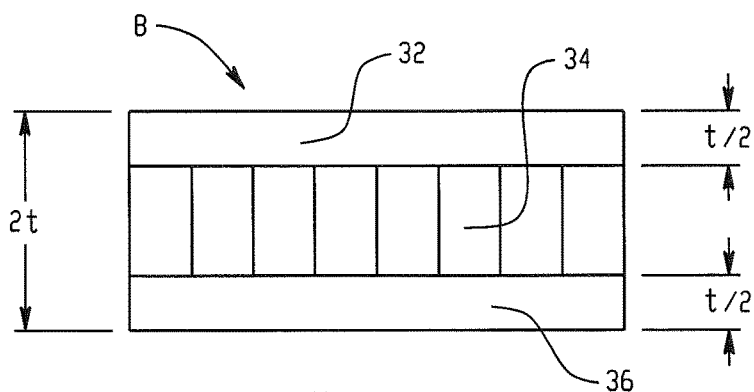
FIG. 7 is a schematic representation of Sample B of Example 1.
Figure 8:
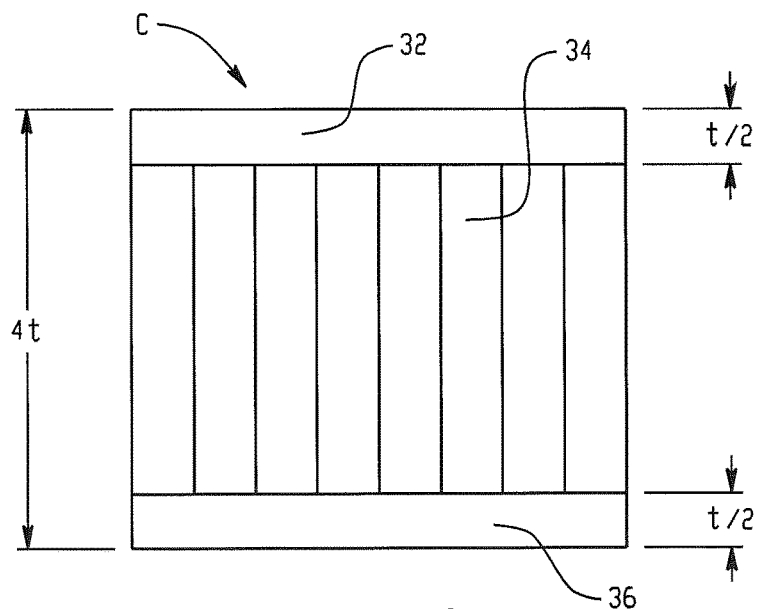
FIG. 8 is a schematic representation of Sample C of Example 1.

The effect of the incorporation of the support layer into the back layer on the stiffness, the flexural strength, and the overall weight was determined Sample A was a solid material of a thickness t (see FIG. 6). Sample B was a back layer comprising a second layer 32, a support layer 34 with a hexagonal array stiffening element, and a third layer 36, where the thickness of the second and third layers is one half that of the thickness of the solid material of Sample A and the overall thickness of the back layer is twice that of Sample A (see FIG. 7). Sample C was a back layer comprising a second layer 32, a support layer 34 with a hexagonal array stiffening element, and a third layer 36, where the thickness of the second and third layers is one half that of the thickness of the solid material of Sample A and the overall thickness of the back layer is four times that of Sample A (see FIG. 8). The relative stiffness, the relative flexural strength, the sample weight, and the relative weight are found in Table 2, where the relative values are relative to Sample A.

TABLE 2

| Sample | A | B | C |
|---|---|---|---|
| Relative Stiffness | 1.0 | 7.0 | 37.0 |
| Relative Flexural Strength | 1.0 | 3.5 | 9.2 |
| Weight (pounds per square foot) | 0.910 | 0.978 | 0.994 |
| Relative Weight | 1.0 | 1.03 | 1.06 |

Table 2 shows the presence of the support layer results in an increase in both the stiffness and the flexural strength and that increasing the thickness of said layer results in further increases of the mechanical properties, while maintaining a low relative weight.

All ranges disclosed herein are inclusive of the endpoints, and the endpoints are independently combinable with each other (e.g., ranges of "up to 25 wt. %, or, more specifically, 5 wt. % to 20 wt. %", is inclusive of the endpoints and all intermediate values of the ranges of "5 wt. % to 25 wt. %," etc.). "Combination" is inclusive of blends, mixtures, alloys, reaction products, and the like. Furthermore, the terms "first," "second," and the like, herein do not denote any order, quantity, or importance, but rather are used to determine one element from another. The terms "a" and "an" and "the" herein do not denote a limitation of quantity, and are to be construed to cover both the singular and the plural, unless otherwise indicated herein or clearly contradicted by context. The suffix "(s)" as used herein is intended to include both the singular and the plural of the term that it modifies, thereby including one or more of that term (e.g., the film(s) includes one or more films). Reference throughout the specification to "one embodiment", "another embodiment", "an embodiment", and so forth, means that a particular element (e.g., feature, structure, and/or characteristic) described in connection with the embodiment is included in at least one embodiment described herein, and may or may not be present in other embodiments. In addition, it is to be understood that the described elements may be combined in any suitable manner in the various embodiments.

All cited patents, patent applications, and other references are incorporated herein by reference in their entirety. However, if a term in the present application contradicts or conflicts with a term in the incorporated reference, the term from the present application takes precedence over the conflicting term from the incorporated reference.

While particular embodiments have been described, alternatives, modifications, variations, improvements, and substantial equivalents that are or may be presently unforeseen may arise to applicants or others skilled in the art. Accordingly, the appended claims as filed and as they may be amended are intended to embrace all such alternatives, modifications variations, improvements, and substantial equivalents.

I claim:

1. A photovoltaic module assembly, comprising:
a first layer comprising poly(methyl methacrylate), polycarbonate, polyamide, or a combination comprising at least one of the foregoing;
a polymeric back layer, wherein the back layer comprises a polymeric second layer, a polymeric third layer, and a polymeric support layer located between the second layer and the third layer, wherein the, the second layer and the third layer each independently comprise a thermoplastic material comprising one or both of a homopolymer or copolymer of a polycarbonate, a polyester, a polyacrylate, a polyamide, a polyetherimide, a polyphenylene ether, or a combination comprising at least one of the foregoing; and
a photovoltaic layer comprising photovoltaic cells, wherein the photovoltaic layer is located between the first layer and the back layer;
wherein the support layer comprises stiffening elements that define openings that extend in a y direction that is perpendicular to a length of the first layer, wherein the stiffening elements comprise diagonal stiffening elements which extend between a z and x direction and at least one of vertical stiffening elements which extend in a z direction and horizontal stiffening elements which extend in an x direction; and
wherein a combined thickness of the second layer and the third layer is less than or equal to 1 mm thick.

2. The photovoltaic module assembly of claim 1, wherein the stiffening elements comprise a triangular array, an R6 array, a hexakis array, or a combination comprising one or more of the foregoing.

3. The photovoltaic module assembly of claim 1, wherein the stiffening elements comprise a honeycomb array.

4. The photovoltaic module assembly of claim 1, wherein the support layer comprises openings, wherein the openings are filled.

5. The photovoltaic module assembly of claim 1, wherein the support layer has a thickness of 1 to 35 mm and wherein the support layer has an opening density of 100 to 1,500 openings per 100 cm$^2$.

6. The photovoltaic module assembly of claim 1, wherein the photovoltaic module has an increased stiffness and/or an increased flexural strength as compared to the photovoltaic module of claim 1 that does not comprise the support layer; wherein the photovoltaic module assembly meets the requirements of the impact test set forth in Paragraph 30 of UL 1703.

7. The photovoltaic module assembly of claim 1, wherein the first layer, the second layer, and the third layer each independently comprise a copolymer of polycarbonate, a linear polycarbonate, a branched polycarbonate, an end-capped polycarbonate, or a combination comprising at least one of the foregoing.

8. The photovoltaic module assembly of claim 1, wherein the first layer comprises poly(methyl methacrylate), polycarbonate, or a combination comprising one or both of the foregoing.

9. The photovoltaic module assembly of claim 1, wherein the first layer comprises poly(methyl methacrylate) and is free from a coating.

10. The photovoltaic module assembly of claim 1, wherein a thickness of the first layer is 0.5 to 25 mm.

11. The photovoltaic module assembly of claim 1, wherein the second layer and/or the third layer comprise an acrylonitrile-styrene-acrylonitrile copolymer, a polycarbonate-acrylonitrile-styrene-acrylonitrile copolymer, poly(phenylene oxide), polypropylene, or a combination comprising one or more of the foregoing.

12. The photovoltaic module assembly of claim 1, wherein the first layer comprises poly(methyl methacrylate) and the second layer and/or the third layer comprise an acrylonitrile-styrene-acrylonitrile copolymer.

13. The photovoltaic module assembly of claim 1, further comprising a connector that connects the first layer comprising poly(methyl methacrylate) to the second layer comprising an acrylonitrile-butadiene-acrylonitrile copolymer; wherein the connector is laser welded to the second layer.

14. The photovoltaic module assembly of claim 1, wherein the first layer has one or both of a haze level of 0% to 6% when measured at a thickness of 5.0 mm or a transparency of greater than or equal to 80 as measured in accordance with ASTM D1003-00, Procedure A or Procedure B, using lamp D65.

15. The photovoltaic module assembly of claim 1, wherein at least one of
the second layer and/or the third layer is opaque;
the second layer is white; and/or
the third layer is black.

16. The photovoltaic module assembly of claim 1, wherein the photovoltaic layer further comprises a cured composition; wherein a refractive index of the first layer and a refractive index of the second layer are within 20% of a refractive index of the cured composition.

17. A photovoltaic module assembly comprising, a first layer, wherein the first layer comprises poly(methyl methacrylate), polycarbonate, or a combination comprising one or both of the foregoing, wherein a thickness of the first layer is 0.5 to 25 mm, wherein the first layer has one or both of a haze level of 0% to 6% when measured at a thickness of 5.0 mm or a transparency of greater than or equal to 80 as measured in accordance with ASTM D1003-00, Procedure A or Procedure B, using lamp D65;
a polymeric back layer, wherein the back layer comprises a polymeric second layer, a polymeric third layer, and a polymeric support layer located between the second layer and the third layer;
wherein the second layer and the third layer each independently comprise an acrylonitrile-styrene-acrylonitrile copolymer, a polycarbonate-acrylonitrile-styrene-acrylonitrile copolymer, poly(phenylene oxide), polypropylene, or a combination comprising one or more of the foregoing; and
a photovoltaic layer comprising photovoltaic cells and a cured composition, wherein the photovoltaic layer is located between the first layer and the polymeric back layer, wherein the photovoltaic layer has a thickness of 2 to 10 mm, wherein a refractive index of the first layer and a refractive index of the second layer are within 20% of a refractive index of the cured composition;
wherein the support layer comprises stiffening elements that define openings that extend in a y direction that is perpendicular to a length of the first layer, wherein the stiffening elements comprise diagonal stiffening elements which extend between a z and x direction and at least one of vertical stiffening elements which extend in a z direction and horizontal stiffening elements which extend in an x direction, wherein the support layer has an opening density of 100 to 1,500 openings per 100 $cm^2$, wherein the support layer has a thickness of 1 to 35 mm, wherein the support layer comprises polypropylene, polyethylene, polystyrene, polyethylene terephthalate, polyamide, polycarbonate, acrylonitrile-butadiene-styrene, acrylonitrile-styrene-acrylonitrile, polyurethane, polyphenylene sulfide, polyetherimide, or a combination comprising one or more of the foregoing; and
wherein a combined thickness of the second layer and the third layer is less than or equal to 1 mm thick;
wherein the photovoltaic module assembly meets the requirements of the impact test set forth in Paragraph 30 of UL 1703.

18. The photovoltaic module assembly of claim 1, further comprising a connector that connects the first layer to the second layer; wherein the connector comprises an acrylic foam tape or an acetate foam tape; wherein the connector has at least one of an adhesive strength of greater than or equal to 0.1 MPa as determined in accordance with ISO 4587-1979 or an elongation at break of greater than or equal to 50% measured in accordance with ISO 4587-1979.

19. The photovoltaic module assembly of claim 1, wherein a surface of the third layer opposite the second layer comprises texturing, fins, ribs, baffles, and combinations comprising at least one of the foregoing and wherein a surface of the first layer opposite the second layer comprises texturing.

20. The photovoltaic module assembly of claim 1, wherein the photovoltaic assembly meets at least one of the requirements as set forth in Paragraph 10.11 of IEC 61215 Edition 2, 2005, the requirements as set forth in Paragraph 10.12 of IEC 61215 Edition 2, 2005, or the requirements as set forth in Paragraph 10.13 of IEC 61215 Edition 2, 2005.

* * * * *